(12) United States Patent　　(10) Patent No.: US 7,635,525 B2
Iwanaga　　(45) Date of Patent: *Dec. 22, 2009

(54) GAS BARRIER LAMINATE FILM AND METHOD FOR PRODUCING THE SAME

(75) Inventor: Hiroshi Iwanaga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 581 days.

This patent is subject to a terminal disclaimer.

(21) Appl. No.: 10/952,853

(22) Filed: Sep. 30, 2004

(65) Prior Publication Data

US 2005/0079380 A1　Apr. 14, 2005

(30) Foreign Application Priority Data

Sep. 30, 2003　(JP) ............................. 2003-342063

(51) Int. Cl.
*B32B 27/00* (2006.01)
*B32B 27/34* (2006.01)
*B32B 27/36* (2006.01)
*B32B 27/40* (2006.01)

(52) U.S. Cl. .................... 428/688; 428/428; 428/423.1; 428/448; 428/447; 313/512; 257/100

(58) Field of Classification Search ................. 428/690, 428/917, 411.1, 688, 446, 447, 500; 313/504, 313/506, 512
See application file for complete search history.

(56) References Cited

U.S. PATENT DOCUMENTS

| | | | |
|---|---|---|---|
| 6,268,695 B1 | 7/2001 | Affinito | |
| 6,492,026 B1 | 12/2002 | Graff et al. | |
| 6,908,647 B2 * | 6/2005 | Obayashi et al. | 428/1.32 |
| 2005/0202265 A1 * | 9/2005 | Naruse et al. | 428/500 |

FOREIGN PATENT DOCUMENTS

| | | |
|---|---|---|
| JP | 53-12953 | 2/1978 |
| JP | 58-217344 A | 12/1983 |
| JP | 2003-53881 A | 2/2003 |

* cited by examiner

*Primary Examiner*—D. Lawrence Tarazano
*Assistant Examiner*—Camie S Thompson
(74) *Attorney, Agent, or Firm*—Sughrue Mion, PLLC (57) ABSTRACT

A gas barrier laminate film including at least one inorganic layer and at least one organic layer on a base material film, wherein the organic layer is a layer formed by ring opening polymerization of at least one kind of oxetanyl group-containing monomer. The gas barrier film can exhibit superior gas barrier properties even if it is flexed and is preferably applicable in image display devices, such as liquid crystal display devices and organic EL devices.

21 Claims, 1 Drawing Sheet

Fig. 1

GAS BARRIER LAMINATE FILM AND METHOD FOR PRODUCING THE SAME

BACKGROUND OF THE INVENTION

1. Field of the Invention

The present invention relates to a gas barrier laminate film having superior gas barrier performance. More precisely, the present invention relates to a gas barrier laminate film that can be suitably used for various kinds of image display devices, in particular, a gas barrier laminate film useful as a substrate of flexible organic electroluminescence device (henceforth referred to as "organic EL device"), and a method for producing the same, as well as an organic EL device.

2. Description of the Background

Conventionally, gas barrier laminate films prepared by forming a thin film of metal oxide such as aluminum oxide, magnesium oxide or silicon oxide on a surface of a plastic substrate or film have been widely used in packaging of articles which require shielding of various gases such as water vapor and oxygen, and packaging use for preventing deterioration of food, industrial materials, medical supplies and so forth. In addition to the packaging use, gas barrier films are recently coming to be used also in liquid crystal display devices, solar cells, EL devices and so forth.

In the course of development of image display devices such as liquid crystal display devices and EL devices in recent years, transparent base materials for forming these devices are required to satisfy highly sophisticated requirements in addition to suitability for production of lighter and larger devices, for example, they must have long term reliability and higher degree of freedom of the shape, they must enable display on a curved surface, and so forth. As a transparent base material that satisfies such sophisticated requirements, plastic base materials are beginning to be adopted as new base materials as an alternative to conventional glass substrates, which are heavy, readily broken and difficult to be formed with a larger size. Plastics base materials not only satisfy the aforementioned requirements, but also show more favorable productivity compared with glass substrates because a roll-to-roll system can be used for them, and therefore they are more advantageous also in view of cost reduction.

However, film base materials such as transparent plastic films have a drawback that their gas barrier performance is inferior to that of glass base materials. If a base material having poor gas barrier property is used, water vapor and air permeate the material to, for example, degrade liquid crystals in a liquid crystal cell, form display defects and thereby degrade display quality. In order to solve this problem, gas barrier laminate films in which a metal oxide thin film is formed on a film substrate have been developed so far. For example, as gas barrier laminate films used for packaging materials or liquid crystal display devices, those comprising a plastic film on which silicon oxide is vapor-deposited (Japanese Patent Publication (KOKOKU) No. 53-12953) and those comprising a plastic film on which aluminum oxide is vapor-deposited (Japanese Patent Laid-open Publication No. 58-217344) are known. These films have a water vapor barrier property of about 1 $g/m^2/day$ represented in terms of permeability.

The gas barrier performance required for plastic film substrates used for recently developed large-sized liquid crystal displays and high precision displays is about 0.1 $g/m^2/day$ in terms of water vapor barrier ability. Furthermore, development of organic EL displays, high precision color liquid crystal displays and so forth has recently progressed, and therefore required are transparent base materials usable for these, i.e., having higher barrier performance, in particular, barrier performance of less than 0.1 $g/m_2/day$ in terms of water vapor barrier ability, while maintaining transparency. In order to meet such a demand, recently studied is film formation by the sputtering method or CVD method as a means that can be expected to provide higher barrier performance, in which a thin film is formed by using plasma generated by glow discharge under a low pressure condition. Moreover, an organic luminescence device in which a barrier film having an alternate laminate structure of organic layers and inorganic layers is produced by the vacuum deposition method is proposed in U.S. Pat. No. 6,268,695 (page 4, [2-5] to page 5, [4-49]). Furthermore, a technique of using acrylic monomers having a volume shrinkage ratio of less than 10% for an organic layer in order to impart flexibility required for applications in flexible display devices is disclosed in Japanese Patent Laid-open Publication (KOKAI) No. 2003-53881 (page 3, [0006] to page 4, [0008]).

However, gas barrier property and flexibility of these materials are insufficient for use as a flexible organic EL display substrate, and further improvement has been desired.

SUMMARY OF THE INVENTION

The present invention was accomplished in view of the aforementioned problems, and the first object of the present invention is to provide a gas barrier laminate film that can maintain superior gas barrier property even when it is flexed. The second object of the present invention is to provide an image display device exhibiting superior durability, which utilizes the aforementioned gas barrier laminate film.

The inventors of the present invention conducted various researches concerning flexibilities of various layers constituting a gas barrier laminate film. As a result, they found that a film in which an oxetanyl group-containing monomer is used for an organic layer could maintain high gas barrier property even when it was flexed, and thus accomplished the present invention. That is, the objects of the present invention are achieved by the gas barrier laminate film, method for producing the same and image display device using the film described below.

(1) A gas barrier laminate film comprising at least one inorganic layer and at least one organic layer on a base material film, wherein the organic layer is a layer formed by ring opening polymerization of at least one kind of oxetanyl group-containing monomer.

(2) The gas barrier laminate film according to (1), wherein the inorganic layer and the organic layer are laminated in this order on the base material film.

(3) The gas barrier laminate film according to (1) or (2), wherein at least one kind of the oxetanyl group-containing monomer is a monomer containing at least two oxetanyl groups in the molecule.

(4) The gas barrier laminate film according to any one of (1) to (3), wherein the organic layer contains silicon.

(5) The gas barrier laminate film according to any one of (1) to (4), wherein at least one kind of the oxetanyl group-containing monomer is a compound containing silicon in the molecule.

(6) The gas barrier laminate film according to any one of (1) to (3), wherein the base material film is a film comprising a resin having a spiro structure represented by the following formula (I) or a polymer having a cardo structure represented by the following formula (II).

Formula (I)

In the formula (I), the rings α represent a monocyclic or polycyclic ring, and two of the rings are bound via a spiro bond.

Formula (II)

In the formula (II), the ring β and the rings γ represent a monocyclic or polycyclic ring, and two of the rings γ may be identical or different and bond to one quaternary carbon atom in the ring β.

(7) A method for producing a gas barrier laminate film comprising forming a base material film, forming an inorganic layer, and forming an organic layer, wherein, in the step of forming an organic layer, the organic layer is formed by ring opening polymerization of at least one kind of oxetanyl group-containing monomer.

(8) The method for producing a gas barrier laminate film according to (7) comprising forming a base material film, forming an inorganic layer, and forming an organic layer, wherein, in the step of forming an organic layer, a composition containing at least one kind of oxetanyl group-containing monomer and a cationic polymerization initiator is applied or vapor-deposited and then irradiated with an active energy ray to form the organic layer.

(9) An image display device using the gas barrier laminate film according to any one of (1) to (6).

(10) An organic electroluminescence device using the gas barrier laminate film according to any one of (1) to (6).

The gas barrier laminate film of the present invention has at least one inorganic layer and at least one organic layer on a base material film, and the organic layer is a layer formed by ring opening polymerization of at least one kind of oxetanyl group-containing monomer. By having such a configuration, the gas barrier laminate film of the present invention can be provided as a gas barrier laminate film that has high flexibility and can maintain high gas barrier property.

Moreover, by using the gas barrier laminate film of the present invention as a substrate, an image display device having superior durability can be provided.

BRIEF EXPLANATION OF THE DRAWING

FIG. 1 is a schematic explanatory view of the roll-to-roll type sputtering apparatus used in Example 1. The sputtering apparatus 1 comprises a vacuum chamber 2, drum 3, feeding roller 4, rolling-up roller 5, plastic film 6, guide roller 7, guide roller 8, exhaust ports 9, vacuum pumps 10, electric discharge power source 11, cathode 12, controller 13, gas flow rate control unit 14, and reactive gas piping 15.

BEST MODE FOR CARRYING OUT THE INVENTION

Hereafter, the gas barrier laminate film of the present invention, the method for producing it, and the organic EL device utilizing the film will be explained in detail.

[Gas Barrier Laminate Film]

The gas barrier laminate film of the present invention has at least one inorganic layer and at least one organic layer on a base material film. Hereafter, each of the members constituting the gas barrier laminate film of the present invention will be explained.

<Base Material Film>

In the present invention, the base material film may be a film that can hold at least one set of an inorganic layer and an organic layer, and a suitable material can be selected depending on the purpose of use of the gas barrier film and so forth. Specific examples of the resin used for the base material film include thermoplastic resins such as methacrylic resins, methacrylic acid/maleic acid copolymers, polystyrene resins, transparent fluororesins, polyimide resins, fluorinated polyimide resins, polyamide resins, polyamideimide resins, polyetherimide resins, cellulose acylate resins, polyurethane resins, polyether ether ketone resins, polycarbonate resins, alicyclic polyolefin resins, polyarylate resins, polyethersulphone resins, polysulfone resins, cycloolefin copolymers, fluorene ring-modified polycarbonate resins, aliphatic ring-modified polycarbonate resins, and acryloyl compounds and so forth.

Among these resins, preferred examples are polyarylate resins (PAr), polyethersulphone resins (PES), fluorene ring-modified polycarbonate resins (BCF-PC, the compound of Japanese Patent Laid-open Publication No. 2000-227603, Example 4), aliphatic ring-modified polycarbonate resins (IP-PC, the compound of Japanese Patent Laid-open Publication No. 2000-227603, Example 5), and acryloyl compounds (the compound of Japanese Patent Laid-open Publication No. 2002-80616, Example 1).

Preferred examples of the resins used for the base material film of the present invention further include resins having a spiro structure represented by the following formula (I) and resins having a cardo structure represented by the following formula (II). These resins have high heat resistance, high elasticity and high tensile fracture strength, and thus they are suitable as substrate materials of organic EL devices and so forth, which must be subjected to various heating operations in the production processes, and are required to have a performance of being unlikely to be broken even when they are flexed.

Formula (I)

In the formula (I), the rings α represent a monocyclic or polycyclic ring, and two of the rings are bound via a spiro bond.

Formula (II)

In the formula (II), the ring β and the rings γ represent a monocyclic or polycyclic ring, and two of the rings γ may be identical or different, and bond to one quaternary carbon atom in the ring β.

Preferred examples of the resins having a spiro structure represented by the formula (I) include polymers containing a spirobiindane structure represented by the following formula (III) in repeating units, polymers containing a spirobichroman structure represented by the following formula (IV) in repeating units, and polymers containing a spirobibenzofuran structure represented by the following formula (V) in repeating units. Preferred examples of the resins having a cardo structure represented by the formula (II) include polymers containing a fluorene structure represented by the following formula (VI) in repeating units.

Formula (III)

In the formula (III), $R^{31}$, $R^{32}$ and $R^{33}$ each independently represent hydrogen atom or a substituent. Groups of each type may bond to each other to form a ring. m and n represent an integer of 1 to 3. Preferred examples of the substituent include a halogen atom, an alkyl group and an aryl group. More preferred examples of $R^{31}$ and $R^{32}$ are hydrogen atom, methyl group and phenyl group, and more preferred examples of $R^{33}$ are hydrogen atom, chlorine atom, bromine atom, methyl group, isopropyl group, t-butyl group and phenyl group.

Formula (IV)

In the formula (IV), $R^{41}$ and $R^{42}$ each independently represent hydrogen atom or a substituent. Groups of each type may bond to each other to form a ring. m and n represent an integer of 1 to 3. Preferred examples of the substituent include a halogen atom, an alkyl group and an aryl group. More preferred examples of $R^{41}$ are hydrogen atom, methyl group and phenyl group, and more preferred examples of $R^{42}$ are hydrogen atom, chlorine atom, bromine atom, methyl group, isopropyl group, t-butyl group and phenyl group.

Formula (V)

In the formula (V), $R^{51}$ and $R^{52}$ each independently represent hydrogen atom or a substituent. Groups of each type may bond to each other to form a ring. m and n represent an integer of 1 to 3. Preferred examples of the substituent include a halogen atom, an alkyl group and an aryl group. More preferred examples of $R^{51}$ are hydrogen atom, methyl group and phenyl group, and more preferred examples of $R^{52}$ are hydrogen atom, chlorine atom, bromine atom, methyl group, isopropyl group, t-butyl group and phenyl group.

Formula (VI)

In the formula (VI), $R^{61}$ and $R^{62}$ each independently represent hydrogen atom or a substituent. Groups of each type may bond to each other to form a ring. j and k represent an integer of 1 to 4. Preferred examples of the substituent include a halogen atom, an alkyl group and an aryl group. More preferred examples of $R^{61}$ and $R^{62}$ are hydrogen atom, chlorine atom, bromine atom, methyl group, isopropyl group, t-butyl group and phenyl group.

The polymers containing a structure represented by any one of the formulas (III) to (VI) in repeating units may be polymers formed with various bonding schemes such as polycarbonates, polyesters, polyamides, polyimides and polyurethanes. The polymers containing a structure represented by any one of the formulas (III) to (VI) are especially preferably polycarbonates derived from bisphenol compounds, polyesters or polyurethanes.

Preferred specific examples of the polymers having a structure represented by the formula (I) or formula (II) are shown below. However, the present invention is not limited to these.

-continued

F-4

F-5

H-1

H-2

H-3

H-4

H-5

H-7

H-8

FL-1

(Isophthaloyl/terephthaloyl copolymer, 50/50 mol %)

FL-2

(Isophthaloyl/terephthaloyl copolymer, 50/50 mol %)

FL-3

(Isophthaloyl/terephthaloyl copolymer, 50/50 mol %)

FL-4

(Isophthaloyl/terephthaloyl copolymer, 50/50 mol %)

FL-5

(Isophthaloyl/terephthaloyl copolymer, 50/50 mol %)

FL-6

FL-7

FL-8

FL-9

Copolymer of FL-8 and FL-9 (80/20 mol %)

FL-11

FL-12

Copolymer of FL-7 and FL-11 (80/20 mol %)

The polymers having a structure represented by the formula (I) or formula (II) usable for the present invention may be used independtly, and may be used as a mixture of two or more kinds of them. Moreover, they may be homopolymers or copolymers consisting of a combination of two or more kinds of the structures. When a copolymer is used, a known repeating unit not containing a structure represented by the formula (I) or (II) in the repeating unit may be copolymerized within such a degree that the advantages of the present invention should not be degraded. Copolymers more often have improved solubility and transparency compared with homopolymers, and such copolymers can be preferably used.

The polymers having a structure represented by the formula (1) or formula (2) used for the present invention preferably has a molecular weight of 10,000 to 500,000, more preferably 20,000 to 300,000, particularly preferably 30,000 to 200,000, in terms of weight average molecular weight. If the molecular weight is less than 10,000, fabrication of the film may become difficult. On the other hand, if the molecular weight exceeds 500,000, it is difficult to control the molecular weight during the synthesis, and handling may become difficult due to unduly high viscosity of solution. The molecular weight may be determined on the basis of corresponding viscosity.

As the resin used for the substrate film of the present invention, crosslinked resins may be also preferably used in view of solvent resistance and heat resistance in addition to the aforementioned thermoplastic resins. As for the types of the crosslinked resins, various known thermosetting resins and radiation-curable resins can be used without particular limitations.

Examples of the thermosetting resins include, for example, phenol resins, urea resins, melamine resins, unsaturated polyester resins, epoxy resins, silicone resins, diallyl phthalate resins, furan resins, bismaleimide resins, cyanate resins and so forth.

As for the crosslinking method, any reactions that form a covalent bond may be used without any particular limitation, and systems in which the reactions proceed at room temperature, such as those utilizing a polyhydric alcohol compound and a polyisocyanate compound to form urethane bonds, can also be used without any particular limitation. However, such systems often have a problem concerning the pot life before the film formation, and therefore such systems are usually used as two-pack systems, in which, for example, a polyisocyanate compound is added immediately before the film formation. On the other hand, if a one-pack system is used, it is effective to protect functional groups to be involved in the crosslinking reaction, and such systems are marketed as blocked type curing agents. Known as the marketed blocked type curing agents are B-882N produced by Mitsui Takeda Chemicals, Inc., Coronate 2513 produced by NIPPON POLYURETHANE INDUSTRY CO., LTD. (these are blocked polyisocyanates), Cymel 303 produced by Mitsui-Cytec Ltd. (methylated melamine resin) and so forth. Moreover, blocked carboxylic acids, which are protected polycarboxylic acids usable as curing agents of epoxy resins, such as B-1 mentioned below are also known.

B-1

The radiation curable resins are roughly classified into radical curable resins and cationic curable resins. As a curable component of the radical curable resins, a compound having two or more radically polymerizable groups in the molecule is used, and as typical examples, compounds having 2 to 6 acrylic acid ester groups in the molecule called polyfunctional acrylate monomers, and compounds having two or more acrylic acid ester groups in the molecule called urethane acrylates, polyester acrylates, and epoxy acrylates are used.

Typical examples of the method for curing radical curable resins include a method of irradiating an electron ray and a method of irradiating an ultraviolet ray. In the method of irradiating an ultraviolet ray, a polymerization initiator that generates a radical by ultraviolet irradiation is usually added. If a polymerization initiator that generates a radical by heating is added, the resins can also be used as thermosetting resins.

As a curable component of the cationic curable resins, a compound having two or more cationic polymerizable groups in the molecule is used. Typical examples of the curing method include a method of adding a photoacid generator that generates an acid by irradiation of an ultraviolet ray and irradiating an ultraviolet ray to attain curing. Examples of the cationic polymerizable compound include compounds containing a ring opening-polymerizable group such as epoxy group and compounds containing a vinyl ether group.

As for each type of the aforementioned thermosetting resins and radiation curable resins, a mixture of two or more kinds of resins may be used for each type, and a thermosetting resin and a radiation curable resin may be used together. Further, a mixture of a crosslinkable resin and a resin not having a crosslinkable group may also be used.

Further, a resin used for the base material film of the present invention is preferably used as a mixture with the aforementioned crosslinkable resin, because solvent resistance, heat resistance, optical characteristics, and toughness of the obtained base material film can be thereby improved. Moreover, in the present invention, it is also possible to introduce a crosslinkable group into a resin used for the base material film, and such a resin may have the crosslinkable group at any of end of polymer main chain, positions in polymer side chain and polymer main chain. When such a resin is used, the base material film may be prepared without using the aforementioned commonly used crosslinkable resin together.

When the gas barrier laminate film of the present invention is used for liquid crystal displays and so forth, it is preferable to use an amorphous polymer in order to attain optical uniformity. Furthermore, for the purpose of controlling retardation (Re) and wavelength dispersion thereof, resins having positive and negative intrinsic birefringences may be combined, or a resin showing a larger (or smaller) wavelength dispersion may be combined.

In the present invention, a laminate of different resins may be used as the base material film in order to control retardation (Re) or improve gas permeability and dynamic characteristics. No particular limitation is imposed on preferred combinations of different resins, and any combinations of the aforementioned resins can be used.

In the present invention, the base material film may be stretched. Stretching provides advantages of improvement of mechanical strengths of the film such as anti-folding strength, and thus improvement of handling property of the film. In particular, a film having an orientation release stress (ASTM D1504, henceforth abbreviated as "ORS") of 0.3 to 3 GPa along the stretching direction is preferred, because mechanical strength of such a film is improved. ORS is internal stress present in a stretched film or sheet generated by stretching.

Known methods can be used for the stretching, and the stretching can be performed by, for example, the roller monoaxial stretching method, tenter monoaxial stretching method, simultaneous biaxial stretching method, sequential biaxial stretching method, or inflation method at a temperature of from a temperature higher than the glass transition temperature (Tg) of the resin by 10° C. to a temperature higher than Tg by 50° C. The stretching ratio is preferably 1.1 to 3.5 times.

In the present invention, although the thickness of the base material film is not particularly limited, it is preferably 30 to 700 μm, more preferably 40 to 200 μm, still more preferably 50 to 150 μm. The haze of the film is preferably 3% or less, more preferably 2% or less, still more preferably 1% or less, irrespective of the thickness of the film. Further, the total light transmission of the base material film is preferably 70% or more, more preferably 80% or more, still more preferably 90% or more.

In the present invention, resin property modifiers such as plasticizers, dyes and pigments, antistatic agents, ultraviolet absorbers, antioxidants, inorganic microparticles, release accelerators, leveling agents, inorganic layered silicate compounds and lubricants may be further added to the base material film as required in such a degree that the advantages of the present invention are not degraded.

<Inorganic Layer>

In the gas barrier laminate film of the present invention, type and film formation method of the inorganic layer are not particularly limited, and known inorganic layers and film formation methods therefor can be used. The inorganic layer includes an inorganic oxide layer and a transparent conductive layer. Although the film formation method of the inorganic layer may be any method so long as a desired thin film can be formed, the sputtering method, vacuum deposition method, ion plating method, plasma CVD method and so forth are preferred. The film formation can be attained by, for example, the methods described in Japanese Patent No. 3400324, Japanese Patent Laid-open Publication Nos. 2002-322561 and 2002-361774.

Although the components constituting the inorganic layer are not particularly limited, for example, oxides, nitrides, oxynitrides etc. containing one or more kinds of elements selected from Si, Al, In, Sn, Zn, Ti, Cu, Ce, Ta and so forth can be used. The thickness of the inorganic layer is not also particularly limited. However, when it is too large, cracks may be generated by bending stress, and when it is too small, the film may be distributed in a dot pattern. In the both cases, water vapor barrier property tends to be degraded. Therefore, the thickness of one inorganic layer is preferably in the range of 5 to 1000 nm, more preferably 10 to 1000 nm, particularly preferably 10 to 200 nm.

Further, when two or more inorganic layers are contained, they may have the same composition or different compositions, and they are not particularly limited. In order to obtain both of water vapor barrier property and high transparency, it is preferable to use silicon oxide or silicon oxynitride in the composition of the inorganic layer. Silicon oxide is represented as $SiO_x$. For example, when $SiO_x$ is used for the inorganic substance layer, x is desirably more than 1.6 and less then 1.9 ($1.6<x<1.9$) in order to obtain both of favorable water vapor barrier property and high light transmission. Silicon oxynitride is represented as $SiO_xN_y$. As for the ratio of x and y, when improvement of adhesion property is emphasized, an oxygen rich film is preferred, and thus it is preferred that x is more than 1 and less than 2, and y is more than 0 and less than 1 ($1<x<2$, $0<y<1$). When improvement of water vapor barrier property is emphasized, a nitrogen rich film is preferred, and thus it is preferred that x is more than 0 and less than 0.8, and y is more than 0.8 and less than 1.3 ($0<x<0.8$, $0.8<y<1.3$).

<Organic Layer>

In the present invention, the organic layer is a layer provided as a layer adjacent to the inorganic layer for the purpose of increasing the gas barrier property of the inorganic layer, and is a layer prepared by ring opening polymerization of at least one kind of monomers containing an oxetanyl group. So long as the organic layer can be formed by ring opening polymerization of monomers containing an oxetanyl group, it may contain inorganic substances, inorganic elements or metallic elements other than the organic component. The organic layer preferably contains silicon.

The "monomer" referred to in the present invention includes oligomers obtained by ring opening polymerization of 2 to 5 units of oxetanyl group-containing unit.

Various oxetanyl group-containing monomers can be used. Examples include compounds having one oxetanyl group in the molecule and compounds having two or more oxetanyl groups in the molecule.

(Compound Having One Oxetanyl Group in the Molecule)

Preferred compounds as the compound having one oxetanyl group in the molecule include the compounds represented by the following formula (1).

Formula (1)

In the formula (1), Z is oxygen atom or sulfur atom. $R^1$ is selected from the group consisting of hydrogen atom, fluorine atom, an alkyl group having 1 to 6 carbon atoms such as methyl group, ethyl group, propyl group and butyl group, a fluoroalkyl group having 1 to 6 carbon atoms, allyl group, an aryl group, furyl group and thienyl group. $R^2$ is selected from the group consisting of an alkyl group having 1 to 6 carbon atoms such as methyl group, ethyl group, propyl group and butyl group; an alkenyl group having 1 to 6 carbon atoms such as 1-propenyl group, 2-propenyl group, 2-methyl-1-propenyl group, 2-methyl-2-propenyl group, 1-butenyl group, 2-butenyl group and 3-butenyl group; an aryl group such as phenyl group, benzyl group, fluorobenzyl group, methoxybenzyl group and phenoxyethyl group; an alkylcarbonyl group having 1 to 6 carbon atoms such as propylcarbonyl group and pentylcarbonyl group; an alkoxycarbonyl group having 1 to 6 carbon atoms such as ethoxycarbonyl group, propoxycarbonyl group and butoxycarbonyl group; an alkylcarbamoyl group having 1 to 6 carbon atoms such as ethoxycarbamoyl group; an alkoxycarbamoyl group having 1 to 6 carbon atoms such as propylcarbamoyl group and butylpentylcarbamoyl group and so forth.

In the present invention, the compounds of the aforementioned formula (1) wherein $R^1$ is a lower alkyl group are preferred, and those wherein $R^1$ is ethyl group are more preferred. $R^2$ is preferably butyl group, phenyl group or benzyl group. Z is preferably oxygen.

(Compound having Two or More Oxetanyl Groups in the Molecule)

Preferred examples of the compound having two or more oxetanyl groups in the molecule include the compounds represented by the following formula (2).

Formula (2)

In formula (2), m is 2, 3 or 4, and Z is oxygen atom or sulfur atom. $R^3$ is hydrogen atom, fluorine atom, an alkyl group having 1 to 6 carbon atoms such as methyl group, ethyl group, propyl group and butyl group, a fluoroalkyl group having 1 to 6 carbon atoms, allyl group, an aryl group or furyl group.

$R^4$ in the formula (2) is, for example, a linear or branched alkylene group having 1 to 12 carbon atoms such as a group represented by following formula (3), a linear or branched poly(alkyleneoxy) group, a group having one of these groups or the like.

Formula (3)

In the formula (3), $R^5$ is a lower alkyl group such as methyl group, ethyl group and propyl group.

$R^4$ may also be a polyvalent group having a structural unit selected from the group consisting of those represented by the following formulas (4), (5) and (6).

Formula (4)

In the formula (4), n is 0 or an integer of 1 to 10. $R^6$ is selected from the group consisting of an alkyl group having 1 to 10 carbon atoms such as methyl group, ethyl group, propyl group and butyl group and a group having a structural unit represented by the following formula (7). $R^7$ is selected from the group consisting of alkyl groups having 1 to 10 carbon atoms such as methyl group, ethyl group, propyl group and butyl group.

Formula (7)

In the formula (7), j is 0 or an integer of 1 to 10, and $R^6$ is an alkyl group having 1 to 10 carbon atoms. $R^7$ is an alkyl group having 1 to 10 carbon atoms such as methyl group, ethyl group, propyl group and butyl group.

Formula (5)

In the formula (5), $R^9$ is hydrogen atom, an alkyl group having 1 to 10 carbon atoms such as methyl group, ethyl group, propyl group and butyl group, an alkoxyl group having 1 to 10 carbon atoms, a halogen atom, nitro group, cyano group, mercapto group, a lower alkylcarboxylate group or carboxyl group.

Formula (6)

In the formula (6), $R^{10}$ is selected from the group consisting O, S, NH, SO, $SO_2$, $CH_2$, $C(CH_3)_2$ and $C(CF_3)_2$.

In the present invention, $R^3$ in the aforementioned formula (2) is preferably a lower alkyl group, more preferably ethyl group. As for $R^4$, $R^9$ in the formula (5) is preferably hydrogen atom or hexamethylene group, and $R^5$ in the formula (3) is preferably ethyl group. $R^7$ is preferably methyl group. Z is preferably oxygen atom.

In the present invention, the organic layer preferably contains a compound having two or more oxetanyl groups in the molecule. Preferred specific examples include the compounds represented by the formula (8) and the compounds represented by the formula (9).

Formula (8)

Formula (9)

In the formula (8), r is an integer of 2 to 100, and $R^{11}$ is an alkyl group having 1 to 4 carbon atoms or a trialkylsilyl group. $R^3$ is the same as that in the formula (2). $R^8$ is an alkyl group having 1 to 10 carbon atoms, and it is preferably methyl group, ethyl group or propyl group, more preferably methyl group. The compound represented by the formula (8) is preferably compounds represented by the following formula (10) and (10-2).

Formula (10)

Formula (10-2)

In the formula (10), $Y^1$, $Y^2$ and $Y^3$ each independently represent hydroxyl group or an alkoxyl group having 1 to 4 carbon atoms, and $R^3$ is the same as that in the formula (2). The compounds of the formula (10) include oligomers represented by the formula (10-2), which are formed from two or more molecules of the compound of the formula (10) wherein $Y^1$ and $Y^3$ are oxygen atoms, each linked via —O—Si—O—Si with other molecules. In the formula (10-2), although n is not particularly limited, it is preferably 0 to 20, more preferably 0 to 5. Specific examples of the compound represented by the formula (10) include silsesquioxanes represented by the formula (11).

Formula (11)

In the formula (11), R is a group represented by the following formula (12).

Formula (12)

The silsesquioxane compounds represented by the formula (11) are most preferably used in view of adhesion to the inorganic layer, low heat deformation property of the low volume shrinkage ratio layer before and after curing, and heat resistance. These monomers may be used individually, or may be used as an arbitrary mixture of two or more kinds of the monomers.

(Cationic Polymerization Initiator)

As the cationic polymerization initiator, known cation type heat polymerization initiators and cation type photopolymerization initiators can be used. Diaryliodonium salts and triarylsulfonium salts, which are photopolymerization initiators, can be preferably used. Typical photopolymerization initiators are shown below.

Formula (13)

Formula (14)

Formula (15)

Formula (16)

In the aforementioned formulas (13) to (15), $R^{12}$ is hydrogen atom, an alkyl group of a variable length having 1 to 18 carbon atoms or an alkoxyl group having 1 to 18 carbon atoms, M is a metal, preferably antimony, X is a halogen atom, preferably fluorine atom, and n is valence of the metal, for example, it is 5 when the metal is antimony. $R^{13}$ in the formula (16) is hydrogen atom, a hydroxyalkyl group or a hydroxyalkoxyl group, preferably hydroxyethoxy group.

The cationic polymerization initiator is added in an amount of preferably 0.01 to 20 parts by weight, more preferably 0.1 to 10 parts by weight, with 100 parts by weight of the monomer containing an oxetanyl group. If the amount is 0.01 part by weight or more, the layer is favorably cured, and desired gas barrier property can be obtained. Further, if it is 20 parts by weight or less, light transmission does not become insufficient, and a uniform organic layer can be formed, thus providing good gas barrier property.

In the present invention, an epoxy resin may be blended with a composition containing the monomer containing an oxetanyl group to be used. Any known epoxy resins may be used as monomers, oligomers or polymers. Preferred examples include the alicyclic epoxy resins represented by the formulas (1) to (6) mentioned in Japanese Patent Laid-open Publication No. 2003-48293. The epoxy resin is desirably blended in an amount of 0 to 50 parts by weight, preferably 20 to 40 parts by weight in view of curing rate, with 100 parts by weight of the oxetanyl group-containing monomer.

Other than epoxy resins, for example, polymers obtained by crosslinking monomers of bifunctionality or higher functionality having acryloyl group or methacryloyl group such as epoxy (meth)acrylate, urethane (meth)acrylate, (meth) acrylic isocyanurate, pentaerythritol (meth)acrylate, trimethylolpropane (meth)acrylate, ethylene glycol (meth)acrylate, and polyester (meth)acrylate may be mixed and used. A mixture of two or more kinds of these monomers of bifunctionality or higher functionality having acryloyl group or methacryloyl group may be used, or a monofunctional (meth) acrylate may be mixed and used. The mixing ratio of these is preferably 20 parts by weight or less with respect to 100 parts by weight of the oxetanyl group-containing monomer.

In the present invention, although the thickness of the organic layer is not particularly limited, it is preferably in the range of 10 nm to 5 μm, more preferably 10 nm to 2 μm, further preferably 50 nm to 0.5 μm. If the thickness of the organic layer is too small, it becomes difficult to obtain uniformity of the thickness, and thus structural defects of the inorganic layer cannot be efficiently filled with the organic layer. Therefore, improvement in barrier property is not obtained. To the contrary, if the thickness of the organic layer is too large, cracks are more likely to be generated by an external force such as bending forth, and thus a problem of reduction of barrier property is caused.

Examples of the method of forming the organic layer in the present invention include an application method, vacuum film formation method and so forth. Although the vacuum film formation method is not particularly limited, vapor deposition, plasma CVD and so forth are preferred, and the resistance heating vapor deposition method is more preferred, in which film formation rate of organic monomers is easily controlled. Although the method of crosslinking the organic monomers of the present invention is not limited at all, crosslinking by means of irradiation of an active energy ray using an electron ray, ultraviolet ray or the like is desirable for the reasons that equipment for it is easily disposed in a vacuum chamber, and it rapidly provides a higher molecular weight by the crosslinking reactions.

When the organic layer is formed by an application method, conventionally used various application methods such as roller coating, photogravure coating, knife coating, dip coating, curtain flow coating, spray coating, and bar coating can be used.

The aforementioned active energy ray means a radiant ray that can propagate energy upon irradiation such as ultraviolet rays, X-rays, electron rays, infrared rays and microwaves, and the type and energy thereof can be arbitrarily chosen according to the use.

The cationic ring opening polymerization of the monomer containing an oxetanyl group is started after a composition containing the monomer is applied or vapor-deposited with, when a thermal polymerization initiator is used, contact heating using a heater, radiation heating using an infrared ray, microwave or the like. When a photopolymerization initiator is used, the polymerization is started with irradiation of an active energy ray. When an ultraviolet ray is irradiated, various light sources can be used, and for example, the curing can be attained by irradiated light from a mercury arc lamp, xenon arc lamp, fluorescence lamp, carbon arc lamp, tungsten/halogen radiation lamp or the like, or sunlight. The irradiation intensity of the ultraviolet ray is at least 0.01 J/cm$^2$. When the organic layer is continuously cured, the irradiation rate is preferably determined so that the composition should be cured within 1 to 20 seconds. When the curing is attained with an electron ray, the curing is attained with an electron ray having energy of 300 eV or less, or it is also possible to instantly cure with irradiation of 1 to 5 Mrad.

The organic layer used in the present invention may be an organic/inorganic hybrid layer prepared by using hydrolysis of a metal alkoxide and a polycondensation reaction (sol/gel reaction) together. As the metal alkoxide, alkoxysilanes and/or metal alkoxides other than alkoxysilanes are used. As the metal alkoxides other than alkoxysilanes, zirconium alkoxides, titanium alkoxides, aluminum alkoxides and so forth are preferred. Moreover, inorganic fillers such as known inorganic microparticles and layered silicates may be mixed in the organic layer as required.

In the gas barrier laminate film of the present invention, at least one inorganic layer and at least one organic layer are provided as a lamination unit on one side or both sides of a base material film. Moreover, one or more sets of inorganic layer and organic layer may be repeatedly and adjacently laminated on the aforementioned lamination unit. When such repeating units are provided, the units are preferably provided in a number of 5 or less, preferably 2 or less, in view of gas barrier property and production efficiency. Further, when the repeating units are formed, the inorganic layers and the organic layers may have the same composition or different compositions, respectively.

<Functional Layer>

The gas barrier laminate film of the present invention can further have any of the following various functional layers in addition to the aforementioned inorganic layer and organic layer.

(Transparent Conductive Layer)

As a transparent conductive layer, known metal films and metal oxide films can be used. Metal oxide films are particularly preferred in view of transparency, conductivity and mechanical characteristics. Examples include, for example, metal oxide films such as those of indium oxide, cadmium oxide, and tin oxide added with tin, tellurium, cadmium, molybdenum, tungsten, fluorine or the like as impurities, zinc oxide, titanium oxide and so forth added with aluminum as impurities. In particular, thin films of indium oxide containing 2 to 15 weight % of tin oxide (ITO) have superior transparency and conductivity, and therefore they are preferably used. Examples of the method of forming the transparent conductive layer include the vacuum deposition method, sputtering method, ion beam sputtering method and so forth.

The film thickness of the transparent conductive layer is preferably in the range of 15 to 300 nm. If the film thickness of the transparent conductive layer is 15 to 300 nm, the film becomes a continuous film, and sufficient conductivity, transparency and flexibility can be obtained.

When the transparent conductive layer is provided as an outermost layer, it may be provided either on the base material film side or the gas barrier coat layer side. However, it is preferably provided on the gas barrier coat layer side in view of prevention of invasion of moisture contained in the base material in a small amount.

(Primer Layer)

In the gas barrier laminate film of the present invention, a known primer layer or inorganic thin film layer can be provided between the base material film and the inorganic layer and organic layer (gas barrier layer). Although acrylic resins, epoxy resins, urethane resins, silicone resins and so forth, for example, can be used as the primer layer, it is preferable in the present invention to use an organic/inorganic hybrid layer as the primer layer or an inorganic vapor-deposited layer or dense inorganic coating thin film prepared by the sol/gel method as the inorganic thin film layer. As the inorganic vapor-deposited layer, vapor-deposited layers of silica, zirconia, alumina and so forth are preferred. The inorganic vapor-deposited layer can be formed by the vacuum deposition method, sputtering method or the like.

(Other Functional Layers)

On the organic layer and the inorganic layer (gas barrier coat layer), or as an outermost layer, various known functional layers may be provided as required. Examples of the functional layers include optically functional layers such as anti-reflection layer, polarization layer, color filter, ultraviolet absorbing layer and light extraction efficiency improving layer, dynamically functional layers such as hard coat layer and stress relaxation layer, electrically functional layers such as antistatic layer and conductive layer, antifogging layer, antifouling layer, printable layer and so forth.

The gas barrier laminate film of the present invention has an oxygen permeability of 0 to 0.1 mL/m$^2$·day·atm, preferably 0 to 0.05 mL/m$^2$·day·atm, more preferably 0 to 0.01 mL/m$^2$·day·atm, at 38° C. and 0% of relative humidity.

Further, the gas barrier laminate film of the present invention has a water vapor permeability of 0 to 0.1 g/m$^2$·day, preferably 0 to 0.05 g/m$^2$·day, more preferably 0 to 0.01 g/m$^2$·day, at 38° C. and 90% of relative humidity.

[Image Display Device]

Although the use of the gas barrier laminate film of the present invention is not particularly limited, it can be suitably used as a transparent electrode substrate of image display device because of its superior optical characteristics and mechanical characteristics. The "image display device" referred to herein means a circularly polarizing plate, liquid crystal display device, touch panel, organic EL device or the like.

<Circularly Polarizing Plate>

A λ/4 plate and a polarizing plate can be laminated on the gas barrier laminate film of the present invention to prepare a circularly polarizing plate. In this case, they are laminated so that the angle formed by the slow axis of the λ/4 plate and the absorption axis of the polarizing plate should become 45°. As such a polarizing plate, one stretched along a direction at an angle of 45° with respect to the machine direction (MD) is preferably used, and for example, the one described in Japanese Patent Laid-open Publication No. 2002-865554 can be suitably used.

<Liquid Crystal Display Device>

A reflection type liquid crystal display device has, in the order from the bottom, a lower substrate, reflective electrode, lower oriented film, liquid crystal layer, upper oriented film, transparent electrode, upper substrate, λ/4 plate and polarizing film. The gas barrier laminate film of the present invention can be used as the aforementioned transparent electrode and upper substrate. In the case of a color display device, it is preferable to further provide a color filter layer between the reflective electrode and the lower oriented film or between the upper oriented film and the transparent electrode.

A transmission type liquid crystal display device has, in the order from the bottom, a back light, polarizing plate, λ/4 plate, lower transparent electrode, lower oriented film, liquid crystal layer, upper oriented film, upper transparent electrode, upper substrate, λ/4 plate, and polarization film. Among these, the gas barrier laminate film of the present invention can be used as the aforementioned upper transparent electrode and upper substrate. In the case of a color display device, it is preferable to further provide a color filter layer between the lower transparent electrode and the lower oriented film or between the upper oriented film and the transparent electrode.

Although type of liquid crystal cell is not particularly limited, more preferred are the TN (Twisted Nematic) type, STN (Supper Twisted Nematic) type, HAN (Hybrid Aligned Nematic) type, VA (Vertically Alignment) type, ECB (Electrically Controlled Birefringence) type, OCB (Optically Compensatory Bend) type and CPA (Continuous Pinwheel Alignment) type.

<Touch Panel>

As for a touch panel, the gas barrier laminate film of the present invention can be applied to those described in Japanese Patent Laid-open Publication Nos. 5-127822, 2002-48913 and so forth.

<Organic EL Device>

When a film prepared according to the present invention is used in an organic EL device, it is preferably used according to the disclosures of Japanese Patent Laid-open Publication Nos. 11-335661, 11-335368, 2001-192651, 2001-192652, 2001-192653, 2001-335776, 2001-247859, 2001-181616, 2001-181617, 2002-181816, 2002-181617, 2002-56976 and others as well as those of Japanese Patent Laid-open Publication Nos. 2001-148291, 2001-221916, 2001-231443 and others. That is, the gas barrier laminate film of the present invention can be used as a base material film and/or a protection film used for the manufacture of an organic EL device.

The present invention will be further specifically explained with reference to the following examples. Although these are examples of effective embodiments of the present invention, the present invention is not limited to these examples.

EXAMPLE 1

1. Preparation of First Inorganic Layer

Figure 1:
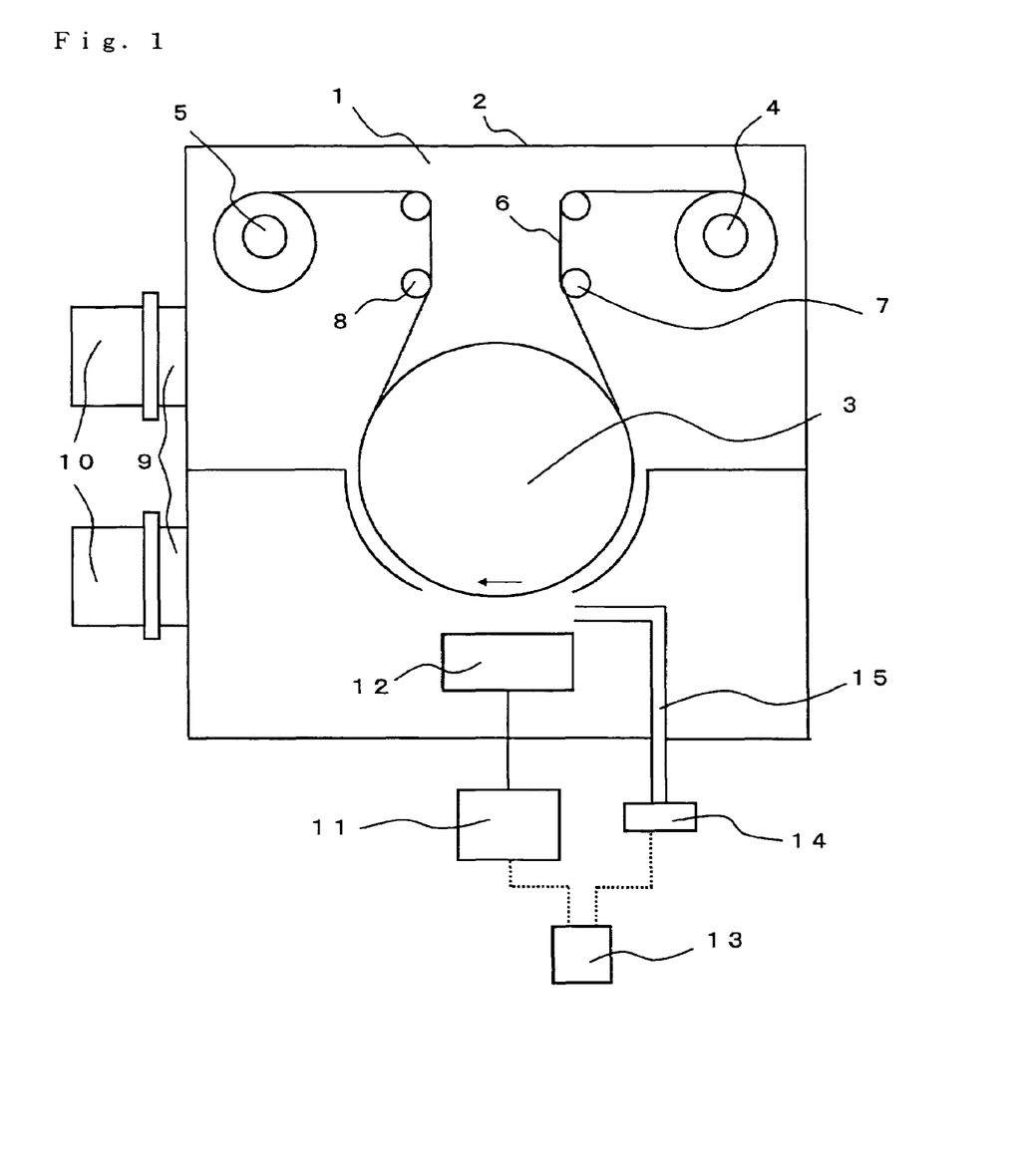

As shown in FIG. 1, an inorganic layer was prepared by using a roll-to-roll type sputtering apparatus 1. This apparatus 1 had a vacuum chamber 2, and a drum 3 for cooling a base material film 6 by contact on the surface was disposed at the center of the chamber. Further, a feeding roller 4 and rolling-up roller 5 for winding the base material film 6 were disposed in the aforementioned vacuum chamber 2. The base material film 6 wound around the feeding roller 4 was wound around the drum 3 via a guide roller 7, and further the base material film 6 was wound around a roller 5 via a guide roller 8. As for a vacuum pumping system, the gas in the vacuum chamber 2 was always evacuated by the vacuum pumps 10 from exhaust ports 9. As for a film formation system, a target (not shown) was placed on a cathode 12 connected to an electric discharge power source 11 of the direct current system, which could apply pulse electric power. This electric discharge power source 11 was connected to a controller 13, and this controller 13 was further connected to a gas flow control unit 14, which supplied reactive gas to the vacuum chamber 2 through a piping 15 while controlling the introduced gas volume. Further, the vacuum chamber 2 was designed so that an electric discharge gas could be supplied to the chamber at a constant flow rate (not shown). Hereafter, specific conditions will be explained.

As the base material film, a polyethersulphone film having a thickness of 100 μm was prepared. Further, Si was set as a target, and a DC power source of the pulse applying type was prepared as the electric discharge power source 11. The vacuum pump was started to evacuate the inside of the vacuum chamber 2 to about $10^{-4}$ Pa, and argon as the electric discharge gas and oxygen as the reactive gas were introduced. When the atmospheric pressure was stabilized, the electric discharge power source was turned on to generate plasma on the Si target at an electric discharge power of 5 kW, and after the film formation pressure was lowered to 0.030 Pa, the sputtering process was started. The voltage value at this point was 610 V. This voltage was considered a preset value, and the discharge voltage was controlled to be maintained constant by transmitting a command from the controller to a piezoelectric valve unit so that when the discharge voltage was lower than the preset value in the transition region, the oxygen flow rate should be increased, and when the discharge voltage was higher than the preset value in the transition region, the oxygen flow rate should be decreased. As described above, an SiOX layer having a thickness of 50 nm was formed on the base material film.

2. Preparation of Organic Layer

A coating composition prepared by mixing 100 parts (part by weight, the same shall apply hereafter) of di[1-ethyl(3-oxetanyl)]methyl ether (OXT-221, Toagosei) and 2 parts of diphenyl-4-thiophenoxysulfonium hexafluoroantimonate as a polymerization initiator was applied on the base material film on which the aforementioned inorganic layer was formed so that the coated thickness should become about 0.4 μm, and then the coated composition was cured by ultraviolet irradiation at such a dose that the composition should be sufficiently cured in the atmosphere (2000 mJ/cm$^2$, confirmed by FT-IR) by using an ultraviolet irradiation apparatus utilizing a high pressure mercury lamp of 395 W (TOSCURE 401, Harrison Toshiba Lighting) to prepare Film 1A.

3. Production of Second Inorganic Layer

An inorganic layer was formed on Film 1A adhered on a guide base as a base material film by using the roll-to-roll type sputtering apparatus shown in FIG. 1 to prepare Film 2A.

EXAMPLE 2

Film 2B was prepared in the same manner as that used in Example 1 except that 1,4-bis{[(3-ethyl-3-oxetanyl)methoxy]methyl}benzene (OXT-121, Toagosei) was used in the same amount instead of the di[1-ethyl(3-oxetanyl)]methyl ether used in Example 1.

EXAMPLE 3

Film 2C was prepared in the same manner as that used in Example 1 except that a coating composition obtained by mixing 100 parts of di[1-ethyl(3-oxetanyl)]methyl ether with 10 parts of 3-ethyl-3-hydroxymethyloxetane (OXT-101, Toagosei), 10 parts of tetraethoxysilane and 0.5 part of water at room temperature for 60 minutes was used instead of the coating composition used in Example 1, and the coated layer was subjected to a heat treatment at 120° C. for 5 minutes.

EXAMPLE 4

In an amount of 12.37 g of 3-ethyl-3-[3-(triethoxysilyl)propyloxymethyl]oxetane synthesized according to the method described in Japanese Patent Laid-open Publication No. 2000-264969, 1.05 g of 10% aqueous solution of tetramethylammonium hydroxide, 1.14 g of water and 300 mL 1,4-dioxane were charged and refluxed by heating with stirring for 16 hours. Then, 200 mL of the solvent was evaporated under reduced pressure to concentrate the reaction system, and the reaction was continued for 6 hours. Thereafter, the solvent and others were evaporated under reduced pressure, 200 mL of toluene was added as substitutive solvent, and the mixture was washed with water and dehydrated to obtain a silsesquioxane compound containing an oxetanyl group. It was confirmed by GPC and NMR that the compound was a silsesquioxane compound containing an oxetanyl group having an average molecular weight (Mn) of about 2000.

Film 2D was prepared in the same manner as that used in Example 1 except that the silsesquioxane compound containing an oxetanyl group obtained above was used instead of the di[1-ethyl(3-oxetanyl)]methyl ether used in Example 1.

COMPARATIVE EXAMPLE 1

Film 2E was prepared in the same manner as that used in Example 1 except that the organic layer was prepared as follows.

An acrylic monomer mixture of 50 mL of tetraethylene glycol diacrylate, 14.5 mL of tripropylene glycol monoacrylate, 7.25 mL of caprolactone acrylate, 10.15 mL of acrylic acid and 10.15 mL of EZACURE (benzophenone mixture photopolymerization initiator, Sartomer) was mixed with 36.25 g of N,N'-bis(3-methylphenyl)-N,N'-diphenylbenzidine solid particles having particle sizes of a wide range from very small size to particle size of sand. Then, the obtained mixture was stirred for about 1 hour on a 20 kHz ultrasonic wave tissue mincer to pulverize the solid particles in order to form a suspension containing fine particles. Subsequently, the obtained mixture was diluted to a concentration of about 20 volume % (36.25 g) and stirred with heating at about 45° C.

Then, a mixture obtained by using the apparatus described in International Patent Application Laid-open Publication in Japanese (KOHYO) No. 2001-518530 was fed to a spray nozzle of 1.30 mm via a small tube having an inner diameter of 2.0 mm and length of 610 mm by using a pump, and the mixture was sprayed there as minute drops by using a 25 kHz ultrasonic atomizer and dropped on a surface maintained at about 340° C. A flash evaporation chamber wall was maintained at about 290° C. to prevent cryocondensation of the monomers on the flash evaporation chamber wall. On Film 1B maintained at a low temperature by using cooling water introduced at a temperature of about 13° C., the vapor was cryocondensed and UV-cured to form an organic layer having a thickness of 4 µm.

COMPARATIVE EXAMPLE 2

Film 2F was prepared in the same manner as that used in Example 1 except that the organic layer was prepared as follows.

By using an experimental film formation apparatus comprising a vapor deposition apparatus provided with resistance heating terminals and an electron gun to which a high pressure mercury UV lamp was attached, an uncured resin obtained by adding 1 weight % of a radical initiator (Irgacure 651, Ciba-Geigy) to dipentaerythritol penta- and hexaacrylate (Aronix M-400, Toagosei) was vapor-deposited as an organic layer in a thickness of about 4 µm. Then, the monomers were cured by UV irradiation using a UV lamp with a cumulative luminous energy of 1000 mJ/cm$^2$ to form an organic layer.

[Measurement of Gas Permeability and Volume Shrinkage Ratio of Organic Layer]

Oxygen permeability at 38° C. and 0% of relative humidity and water vapor permeability at 38° C. and 90% of relative humidity of Films 2A to 2F were measured by the MOCON method. Further, samples obtained by film formation under the same conditions on aluminum plates were collected, and volume shrinkage ratio of the samples after the UV curing was measured according to the method described in JIS K6901, Appendix 3. The results are shown in Table 1.

TABLE 1

| Film | Oxygen permeability (mL/m$^2$ · day · atm) | Water vapor permeability (g/m$^2$ · day) | Volume shrinkage ratio after UV curing (%) | Remarks |
|---|---|---|---|---|
| 2A | Less than 0.005 | Less than 0.005 | 2.8 | Invention |
| 2B | Less than 0.005 | 0.06 | 4.8 | Invention |
| 2C | Less than 0.005 | Less than 0.005 | 0.8 | Invention |
| 2D | Less than 0.005 | Less than 0.005 | 0.1 | Invention |
| 2E | Less than 0.005 | 0.21 | 21.1 | Comparative |
| 2F | Less than 0.005 | 0.08 | 15.5 | Comparative |

Note:
"Less than 0.005" means a permeability lower than detection limits of the currently available measurement apparatuses.

[Flexing Resistance Test]

Films 2A to 2F were cut into a size of 20 cm×30 cm, both ends of each were adhered to form a cylinder with the barrier coat layer as the outer surface, and the films were transported by rotation at a rate of 30 cm/minutes between two of transportation rollers having a diameter of 12 mm between which a tension of about 1 N was applied, while paying attentions so that the films should fully contact with the rollers and the films should not slip on the rollers. The samples were conditioned for moisture content in an environment of 25° C. and 60% RH for 8 hours, and the test was performed in a laboratory of the same conditions.

After the above procedure, water vapor barrier property was measured under the same conditions as those mentioned above. Further, the films were observed by visual inspection and under an optical microscope. The results are shown in Table 2.

TABLE 2

| Film | Water vapor permeability before flexing test (g/m²·day) | Water vapor permeability before flexing test (g/m²·day) | Appearance by visual inspection | Observation under optical microscope | Remarks |
|---|---|---|---|---|---|
| 2A | Less than 0.005 | Less than 0.005 | No change | No change | Invention |
| 2B | 0.06 | 0.06 | No change | No change | Invention |
| 2C | Less than 0.005 | Less than 0.005 | No change | No change | Invention |
| 2D | Less than 0.005 | Less than 0.005 | No change | No change | Invention |
| 2E | 0.21 | Not less than 100 | Whitened | Cracks | Comparative |
| 2F | 0.08 | 12 | No change | Slightly scratched | Comparative |

Note:
"Less than 0.005" means a permeability lower than detection limits of the currently available measurement apparatuses.

As shown in Tables 1 and 2, all of the gas barrier laminate films of the present invention showed characteristics that they had a higher gas barrier property compared with those of the comparative examples, and the gas barrier property was not degraded even after the films were flexed. Further, the gas barrier laminate films of the present invention exhibiting small volume shrinkage ratio after the UV curing showed improvement in both of the gas barrier property and flexibility.

On the basis of the above, it can be seen that the gas barrier laminate film of the present invention is a film having flexing resistance and high gas barrier performance. Although the reason why the gas barrier laminate film of the present invention shows flexing resistance and high gas barrier performance is not definite, it is estimated that adhesion between the inorganic layer and the organic layer is improved by reduction of shrinkage of the organic layer provided by the crosslinking reaction, thus potential distortion generated at the interface of the inorganic layer and the organic layer becomes small, and as a result, the critical fracture stress becomes substantially higher. It is further estimated that, with the gas barrier laminate film of the present invention, because active sites are more unlikely to be deactivated in cationic polymerization compared with radical polymerization, and the polymerization reaction at the interface of the inorganic layer involved in the adhesion is not inhibited by radical quenchers such as impurities present at the interface of the inorganic layer, defects of the inorganic layer are effectively compensated, and the high crosslinking density of the organic layer itself greatly reduces the gas permeability.

EXAMPLE 5

1. Preparation of Base Material Film and Laminate Film

Resin compound (C-3) according to the present invention was dissolved in dichloromethane at a concentration of 15 weight % and cast on a stainless steel band by the die coating method. Then, the first film was stripped off from the band, and dried until the remaining solvent concentration became 0.08 weight %. The film was trimmed and knurled for the both edges, and the film was rolled up to prepare Film 1G having a thickness of 100 μm. Furthermore, Laminate film 2G was prepared in the same manner as that used in Example 1 except that the base material film was changed to Film 1G.

SYNTHESIS EXAMPLE of C-3

M-100

In an amount of 235.59 g (646.8 mmol) of M-100, 9.171 g (33 mmol) of tetrabutylammonium chloride, 2805 mL of dichloromethane and 2475 mL of water were put into a reaction vessel provided with a stirrer and stirred at 300 rpm on a water bath under a nitrogen flow. After 30 minutes, 134.05 g (660 mmol) of terephthaloyl chloride was added as powder and washed away with 330 mL of dichloromethane. After 10 minutes, a solution obtained by dissolving 3.966 g (26.4 mmol) of p-tert-butylphenol in 693 mL of 2 M (2 N) aqueous sodium hydroxide and diluting the resultant with 132 mL of water was added dropwise to the reaction mixture over 1 hour using a dropping apparatus, and the reaction mixture was washed with 165 mL of water. Thereafter, stirring was continued for 3 hours, then 1 L of dichloromethane was added, and the organic phase was separated. Further, the organic phase was washed by adding a solution obtained by diluting 6.6 mL of 12 M (12 N) aqueous hydrochloric acid with 2.5 L of water. Washing was further performed twice with 2.5 L of water, and the separated organic phase was added with 1 L of dichloromethane for dilution and poured into 25 L of vigorously stirred methanol over 1 hour. The white precipitates obtained in the methanol were collected by filtration, dried by heating at 40° C. for 12 hours, and then dried at 70° C. for 3 hours under reduced pressure to obtain 307.2 g of the objective Compound C-3.

The molecular weight of the obtained Compound C-3 was measured by GPC (THF solvent), and as a result, the weight average molecular weight was found to be 61000.

2. Preparation of Organic EL Devices

Each of Films 2A and 2G was introduced into a vacuum chamber, and a transparent electrode composed of an IXO thin film having a thickness of 0.2 μm was formed by DC magnetron sputtering using an IXO target. An aluminum lead wire was connected to the transparent electrode (IXO) to form a laminated structure. An aqueous dispersion of polyethylene dioxythiophene/polystyrenesulfonic acid (Baytron P, BAYER, solid content: 1.3 weight %) was applied on the surface of the transparent electrode by spin coating and vacuum-dried at 150° C. for 2 hours to form a hole transporting organic thin film layer having a thickness of 100 nm. This was designated Substrate X.

Further, a coating solution for light-emitting organic thin film layer having the following composition was applied on one side of a temporary support made of polyethersulfone having a thickness of 188 μm (SUMILITE FS-1300, Sumitomo Bakelite) by using a spin coater and dried at room temperature to form a light-emitting organic thin film layer having a thickness of 13 nm on the temporary support. This was designated Transfer Material Y.

| | |
|---|---|
| Polyvinyl carbazole (Mw = 63000, Aldrich) | 40 parts by weight |
| Tris(2-phenylpyridine) iridium complex (Ortho-metalated complex) | 1 part by weight |
| Dichloroethane | 3200 parts by weight |

The light-emitting organic thin film layer side of Transfer Material Y was overlaid on the upper surface of the organic thin film layer of Substrate X mentioned above, heated and pressurized under the conditions of 160° C., 0.3 MPa and 0.05 m/min by using a pair of heat rollers, and the temporary support was delaminated to form a light-emitting organic thin film layer on the upper surface of Substrate X. This was designated Substrate XY.

Further, a patterned mask for vapor deposition (mask providing a light-emitting area of 5 mm×5 mm) was set on one side of a polyimide film (UPILEX-50S, Ube Industries) cut into a 25-mm square and having a thickness of 50 μm, and Al was vapor-deposited in a reduced pressure atmosphere of about 0.1 MPa to form an electrode having a film thickness of 0.3 μm. LiF was vapor-deposited by DC magnetron sputtering using a LiF target with a film thickness of 3 nm in the same pattern as the Al layer. An aluminum lead wire was connected to the Al electrode to form a laminated structure. A coating solution for electron transporting organic thin film layer having the following composition was applied on the obtained laminated structure by using a spin coater and vacuum-dried at 80° C. for 2 hours to form an electron transporting organic thin film layer having a thickness of 15 nm on LiF. This was designated Substrate Z.

| | |
|---|---|
| Polyvinyl butyral (2000L produced by Denki Kagaku Kogyo, Mw = 2000,) | 10 parts by weight |
| 1-Butanol | 3500 parts by weight |
| Electron transporting compound having the following structure | 20 parts by weight |

Substrate XY and Substrate Z were stacked so that the electrodes should face each other via the light-emitting organic thin film layer between them, heated and pressurized at 160° C., 0.3 MPa and 0.05 m/min by using a pair of heat rollers to obtain Organic EL Device 3A and 3G. As comparative organic EL devices, Organic EL Devices 3E and 3F were also prepared by using Films 2E and 2F respectively in the production of Substrate X.

DC voltage was applied to the obtained Organic EL Devices 3A, 3E, 3F and 3G by using Source-Measure Unit Model 2400 (Toyo Corporation) to allow them to emit light. All of the organic EL devices favorably emitted light. After the production of Organic EL devices 3A, 3E, 3F and 3G, they were left at 25° C. and relative humidity of 75% for 1 month, and then similarly allowed to emit light. As a result, Organic EL devices 3A and 3G similarly showed favorable light emission, whereas about 20% and about 5% of non-light emitting portions with respect to the initial light-emitting areas were observed in Organic EL devices 3E and 3F, respectively.

Furthermore, a procedure of winding light-emitting surfaces of separately prepared Organic EL Devices 3A, 3E, 3F and 3G around a roller having a diameter of 12 mm and unwinding them into planes was repeated 100 times, and the devices were left at 40° C. and relative humidity of 90% for 10 days, and then similarly allowed to emit light. As a result, Organic EL device 3G similarly showed favorable light emission, and Organic EL device 3A showed about 5% of non-light emitting portion. On the other hand, both of Organic EL devices 3E and 3F showed non-light emitting portion exceeding 80%, and thus they were evidently degraded. It is estimated that the reason why the difference was observed between the results of Organic EL devices 3A and 3G having a difference in the base material is that the base material film having superior flexibility contributed to prevention of slight degradation of the laminated barrier layer.

Because the gas barrier laminate film of the present invention can maintain superior gas barrier property even if it is flexed, it can be used as a substrate of an image display device showing superior durability.

The present disclosure relates to the subject matter contained in Japanese Patent Application No. 342063/2003 filed on Sep. 30, 2003 and Japanese Patent Application No. 036738/2004 filed on Feb. 13, 2004, which are expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas barrier laminate film comprising at least one inorganic layer and at least one organic layer on a base material film, wherein the organic layer is a layer formed by ring opening polymerization of at least one kind of oxetanyl group-containing monomer,
   wherein the base material film is formed with a resin having a spiro structure represented by the following formula (I) or a resin having a cardo structure represented by the following formula (II):

Formula (I)

wherein the rings α represent a monocyclic or polycyclic ring, and two of the rings are bound via a spiro bond, Formula (II)

wherein the ring β and the rings γ represent a monocyclic or polycyclic ring, and two of the rings γ may be identical or different and bond to one quaternary carbon atom in the ring β.

2. The gas barrier laminate film according to claim 1, wherein at least one kind of the oxetanyl group-containing monomer is represented by the following formula (1):

Formula (1)

wherein Z is oxygen atom or sulfur atom, $R^1$ is hydrogen atom, fluorine atom, an alkyl group having 1 to 6 carbon atoms, a fluoroalkyl group having 1 to 6 carbon atoms, allyl group, an aryl group, furyl group and thienyl group, $R^2$ is an alkyl group having 1 to 6 carbon atoms, an alkenyl group having 1 to 6 carbon atoms, an aryl group, an alkylcarbonyl group having 1 to 6 carbon atoms, an alkoxycarbonyl group having 1 to 6 carbon atoms, an alkylcarbamoyl group having 1 to 6 carbon atoms or an alkoxycarbamoyl group having 1 to 6 carbon atoms.

3. The gas barrier laminate film according to claim 1, wherein at least one kind of the oxetanyl group-containing monomer contains silicon in the molecule.

4. The gas barrier laminate film according to claim 1, wherein at least one kind of the oxetanyl group-containing monomer is a compound containing at least two oxetanyl groups in the molecule.

5. The gas barrier laminate film according to claim 1, wherein the monomer containing at least two oxetanyl groups in the molecule is a compound represented by the following formula (2):

Formula (2)

wherein Z is oxygen atom or sulfur atom, $R^3$ is hydrogen atom, fluorine atom, an alkyl group having 1 to 6 carbon atoms, a fluoroalkyl group having 1 to 6 carbon atoms, allyl group, an aryl group or furyl group, $R^4$ is a group having a linear or branched alkylene group having 1 to 12 carbon atoms or a linear or branched poly(alkyleneoxy) group and m is 2, 3 or 4.

6. The method for producing a gas barrier laminate film according to claim 5 comprising forming a base material film, forming an inorganic layer, and forming an organic layer, wherein, in the step of forming an organic layer, a composition containing at least one kind of oxetanyl group-containing monomer and a cationic polymerization initiator is applied or vapor-deposited and then irradiated with an active energy ray to form the organic layer.

7. The gas barrier laminate film according to claim 1, wherein the inorganic layer and the organic layer are laminated in this order on the base material film.

8. The gas barrier laminate film according to claim 1, wherein the organic layer contains silicon.

9. The gas barrier laminate film according to claim 1, wherein the base material film is formed with a resin having a spiro structure represented by the following formula (III):

Formula (III)

wherein $R^{31}$, $R^{32}$ and $R^{33}$ each independently represent hydrogen atom or a substituent, groups of each type may bond to each other to form a ring, and m and n represent an integer of 1 to 3.

10. The gas barrier laminate film according to claim 1, wherein the base material film is formed with a resin having a spiro structure represented by the following formula (IV):

Formula (IV)

wherein $R^{14}$ and $R^{42}$ each independently represent hydrogen atom or a substituent, groups of each type may bond to each other to form a ring, and m and n represent an integer of 1 to 3.

11. The gas barrier laminate film according to claim 1, wherein the base material film is formed with a resin having a spiro structure represented by the following formula (V):

Formula (V)

wherein $R^{15}$ and $R^{52}$ each independently represent hydrogen atom or a substituent, groups of each type may bond to each other to form a ring, and m and n represent an integer of 1 to 3.

12. The gas barrier laminate film according to claim 1, wherein the base material film is formed with a resin having a cardo structure represented by the following formula (VI):

Formula (VI)

wherein $R^{61}$ and $R^{62}$ each independently represent hydrogen atom or a substituent, groups of each type may bond to each other to form a ring, and j and k represent an integer of 1 to 4.

13. A method for producing a gas barrier laminate film according to claim 1 comprising forming a base material film, forming an inorganic layer, and forming an organic layer, wherein, in the step of forming an organic layer, the organic layer is formed by ring opening polymerization of at least one kind of oxetanyl group-containing monomer.

14. An image display device having the gas barrier laminate film according to claim 1.

15. An organic electroluminescence device having the gas barrier laminate film according to claim 1.

16. A gas barrier laminate film comprising at least one inorganic layer and at least one organic layer on a base material film, wherein the organic layer is a layer formed by ring opening polymerization of at least one kind of oxetanyl group-containing monomer,
wherein the monomer containing at least two oxetanyl groups in the molecule is a compound represented by the following formula (8):

Formula (8)

wherein $R^3$ is hydrogen atom, fluorine atom, an alkyl group having 1 to 6 carbon atoms, a fluoroalkyl group having 1 to 6 carbon atoms, allyl group, an aryl group or furyl group, $R^8$ is an alkyl group having 1 to 10 carbon atoms, $R^{11}$ is an alkyl group having 1 to 4 carbon atoms or a trialkylsilyl group, and r is an integer of 2 to 100.

17. The gas barrier laminate film according to claim 16, wherein $R^3$ is selected from the group consisting of a methyl group, an ethyl group, a propyl group and a butyl group.

18. A gas barrier laminate film comprising at least one inorganic layer and at least one organic layer on a base material film, wherein the organic layer is a layer formed by ring opening polymerization of at least one kind of oxetanyl group-containing monomer,
wherein the monomer containing at least two oxetanyl groups in the molecule is a compound represented by the following formula (9):

Formula (9)

wherein $R^3$ is hydrogen atom, fluorine atom, an alkyl group having 1 to 6 carbon atoms, a fluoroalkyl group having 1 to 6 carbon atoms, allyl group, an aryl group or furyl group.

19. The gas barrier laminate film according to claim 18, wherein $R^3$ is selected from the group consisting of a methyl group, an ethyl group, a propyl group and a butyl group.

20. A gas barrier laminate film comprising at least one inorganic layer and at least one organic layer on a base material film, wherein the organic layer is a layer formed by ring opening polymerization of at least one kind of oxetanyl group-containing monomer,
wherein the monomer containing at least two oxetanyl groups in the molecule is a compound represented by the following formula (10):

wherein $Y^1$, $Y^2$ and $Y^3$ each independently represent hydroxyl group or an alkoxyl group having 1 to 4 carbon atoms, and $R^2$ is hydrogen atom, fluorine atom, an alkyl group having 1 to 6 carbon atoms, a fluoroalkyl group having 1 to 6 carbon atoms, allyl group, an aryl group or furyl group.

21. A gas barrier laminate film comprising at least one inorganic layer and at least one organic layer on a base material film, wherein the organic layer is a layer formed by ring opening polymerization of at least one kind of oxetanyl group-containing monomer,
wherein the monomer containing at least two oxetanyl groups in the molecule is a compound represented by the following formula (10-2):

wherein $Y^1$, $Y^2$ and $Y^3$ each independently represent hydroxyl group or an alkoxyl group having 1 to 4 carbon atoms, and $R^3$ is hydrogen atom, fluorine atom, an alkyl group having 1 to 6 carbon atoms, a fluoroalkyl group having 1 to 6 carbon atoms, allyl group, an aryl group or furyl group.

* * * * *